(12) United States Patent
Ding et al.

(10) Patent No.: US 11,114,524 B2
(45) Date of Patent: Sep. 7, 2021

(54) SEMICONDUCTOR DEVICE

(71) Applicant: Samsung Electronics Co., Ltd., Suwon-si (KR)

(72) Inventors: Shaofeng Ding, Suwon-si (KR); Jinho Park, Seoul (KR); Yongseung Bang, Suwon-si (KR); Jeong Hoon Ahn, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 92 days.

(21) Appl. No.: 16/439,947

(22) Filed: Jun. 13, 2019

(65) Prior Publication Data

US 2020/0135843 A1 Apr. 30, 2020

(30) Foreign Application Priority Data

Oct. 30, 2018 (KR) .................. 10-2018-0131069

(51) Int. Cl.
*H01L 23/522* (2006.01)
*H01L 21/768* (2006.01)
*H01L 49/02* (2006.01)
*H01L 23/528* (2006.01)
*H01L 21/033* (2006.01)
*H01L 21/311* (2006.01)
*H01L 23/532* (2006.01)

(52) U.S. Cl.
CPC .......... *H01L 28/60* (2013.01); *H01L 21/0337* (2013.01); *H01L 21/31144* (2013.01); *H01L 21/76897* (2013.01); *H01L 23/5226* (2013.01); *H01L 23/5283* (2013.01); *H01L 23/53295* (2013.01)

(58) Field of Classification Search
CPC ......... H01L 28/40; H01L 28/60; H01L 28/75; H01L 23/5222; H01L 23/5223; H01L 23/5226; H01L 21/76877; H01L 21/76879; H01L 21/76804–76807; H01L 21/76816; H01L 23/5286
See application file for complete search history.

(56) References Cited

U.S. PATENT DOCUMENTS

| 9,219,110 | B2 | 12/2015 | Wang et al. |
| 9,391,016 | B2 | 7/2016 | Shen et al. |
| 9,466,661 | B2 | 10/2016 | Triyoso et al. |
| 9,627,312 | B2 | 4/2017 | Childs et al. |
| 9,761,655 | B1 | 9/2017 | Ando et al. |
| 10,446,483 | B2 * | 10/2019 | Gu ..................... H01L 23/5223 |
| 2005/0116276 | A1 | 6/2005 | Gau |
| 2014/0159200 | A1 | 6/2014 | Loke et al. |

* cited by examiner

*Primary Examiner* — Jose R Diaz
(74) *Attorney, Agent, or Firm* — Harness, Dickey & Pierce, P.L.C.

(57) ABSTRACT

A semiconductor device including a first electrode on a substrate, a second electrode on the first electrode, a first dielectric layer between the first electrode and the second electrode; a third electrode on the second electrode, a second dielectric layer between the second electrode and the third electrode, and a first contact plug penetrating the third electrode and contacting the first electrode, the first contact plug contacts a top surface of the third electrode and a side surface of the third electrode.

20 Claims, 16 Drawing Sheets

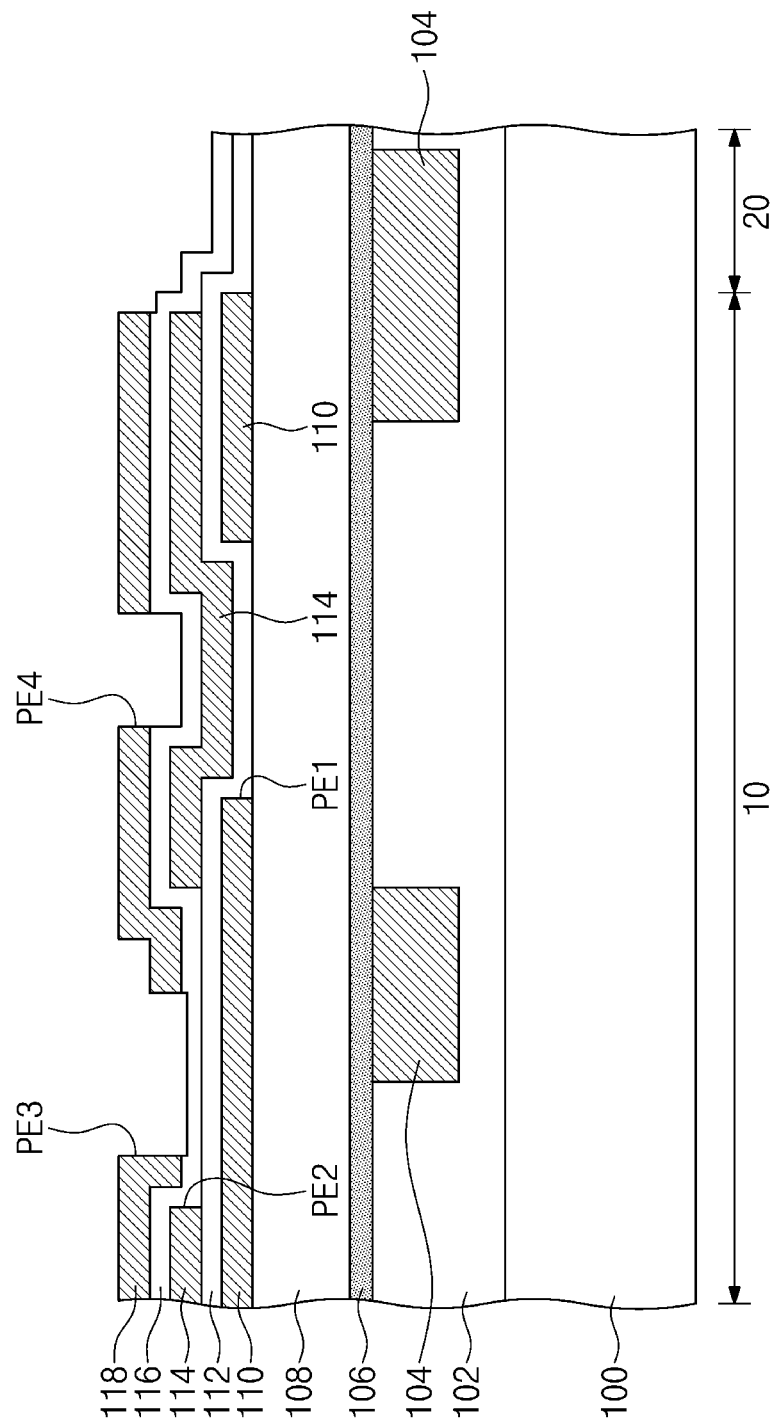

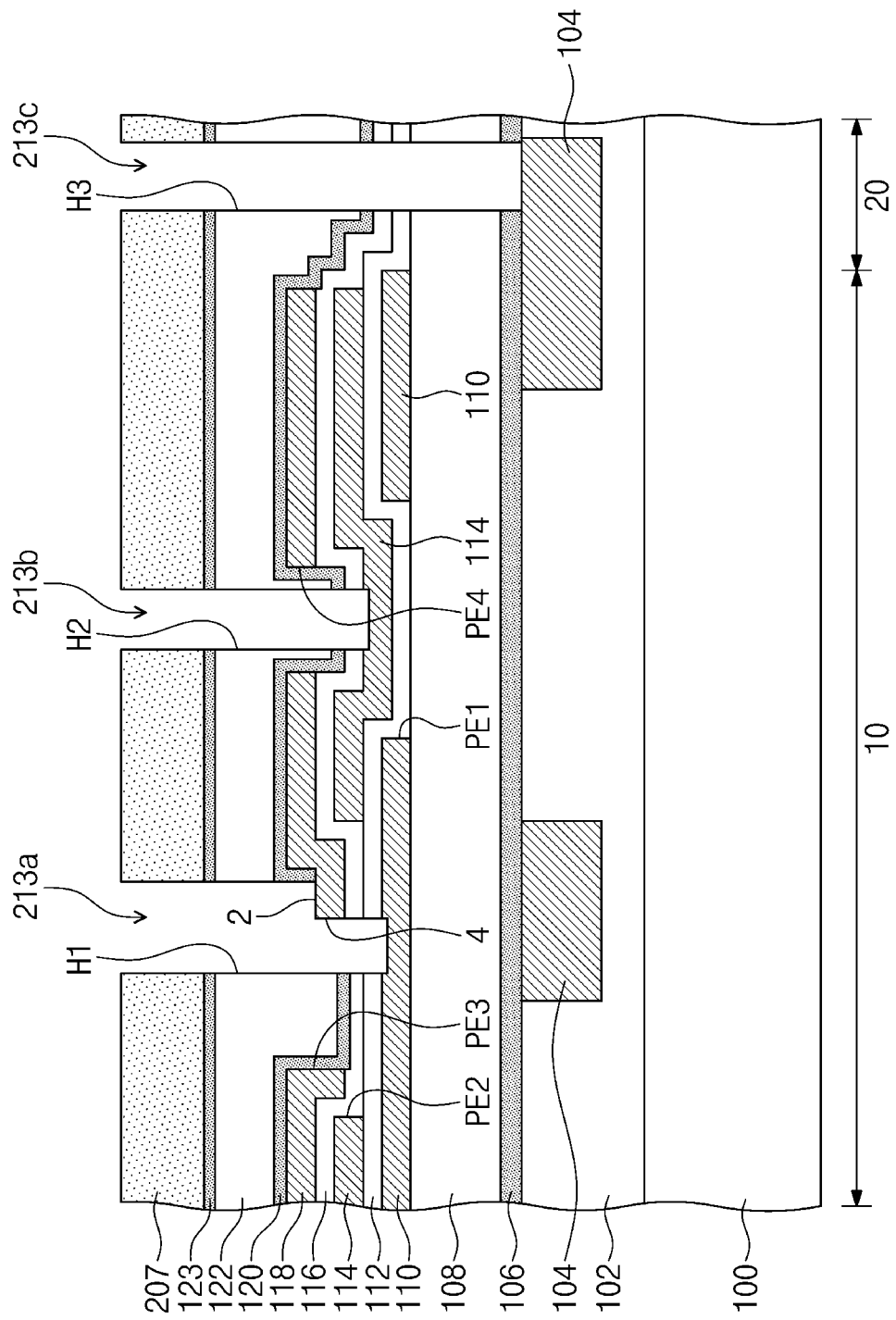

SEMICONDUCTOR DEVICE

CROSS-REFERENCE TO RELATED APPLICATION

This U.S. nonprovisional application claims priority under 35 U.S.C § 119 to Korean Patent Application No. 10-2018-0131069 filed on Oct. 30, 2018 in the Korean Intellectual Property Office, the entire contents of which are hereby incorporated by reference.

BACKGROUND

The present inventive concepts relate to semiconductor devices, and more particularly, to semiconductor devices including a metal-insulator-metal (MIM) capacitor.

Generally, as the integration (e.g., density) of semiconductor devices, such as random access memory (DRAM) devices, increases, the physical area (e.g., size) of a unit cell (e.g., a DRAM memory cell) decreases, and in turn the area occupied by a capacitor of the unit cell also decreases. It would be desirable for a capacitor to maintain a similar capacitance in spite of this reduction in area of the capacitor. Accordingly, structures and/or fabrication methods that increase capacitance would be desirable in order to support greater integration of semiconductor devices.

With respect to metal-insulator-semiconductor capacitors, when the thickness of a dielectric layer is reduced to increase capacitance, leakage current characteristics may deteriorate. Accordingly, it is desirable employ a high-k dielectric layer, or a dielectric layer whose dielectric constant is high. However, when a high-k dielectric layer is used in a metal-insulator-semiconductor capacitor, a low-k dielectric layer is formed between the high-k dielectric layer and a polysilicon layer that serves as a top electrode of the capacitor, with the result that a desired capacitance may not be obtained. Therefore, a metal-insulator-metal (MIM) capacitor has been introduced to replace a metal-insulator-semiconductor capacitor.

SUMMARY

Some example embodiments of the present inventive concepts provide a semiconductor device with improved electrical characteristics.

According to some example embodiments of the present inventive concepts, a semiconductor device may include a first electrode on a substrate; a second electrode on the first electrode; a first dielectric layer between the first electrode and the second electrode; a third electrode on the second electrode; a second dielectric layer between the second electrode and the third electrode; and a first contact plug penetrating the third electrode and contacting the first electrode. The first contact plug may contact a top surface of the third electrode and a side surface of the third electrode.

According to some example embodiments of the present inventive concepts, a semiconductor device may include a first electrode on a substrate, the first electrode having a first penetrating portion; a first dielectric layer on a top surface of the first electrode and in the first penetrating portion; a second electrode on the first dielectric layer, the second electrode having a second penetrating portion that does not overlap the first penetrating portion; a second dielectric layer on a top surface of the second electrode and in the second penetrating portion; a third electrode on the second dielectric layer, the third electrode having a third penetrating portion and a fourth penetrating portion, the third penetrating portion overlapping the second penetrating portion, the fourth penetrating portion overlapping the first penetrating portion; and a first contact plug in the second and third penetrating portions, the first contact plug connecting the first electrode to the third electrode.

According to some example embodiments of the present inventive concepts, a semiconductor device may include a first electrode on a substrate; a second electrode on the first electrode; a third electrode on the second electrode; a dielectric layer between the first electrode, the second electrode and the third electrode; a first contact plug connecting the first electrode to the third electrode; and a second contact plug penetrating a portion of the dielectric layer and contacting the second electrode, wherein a bottom surface of the first contact plug is positioned higher than a bottom surface of the first electrode.

BRIEF DESCRIPTION OF THE DRAWINGS

FIGS. 7A to 7G illustrate cross-sectional views showing a method of fabricating a semiconductor device according to some example embodiments of the present inventive concepts.

DETAILED DESCRIPTION

Figure 1:
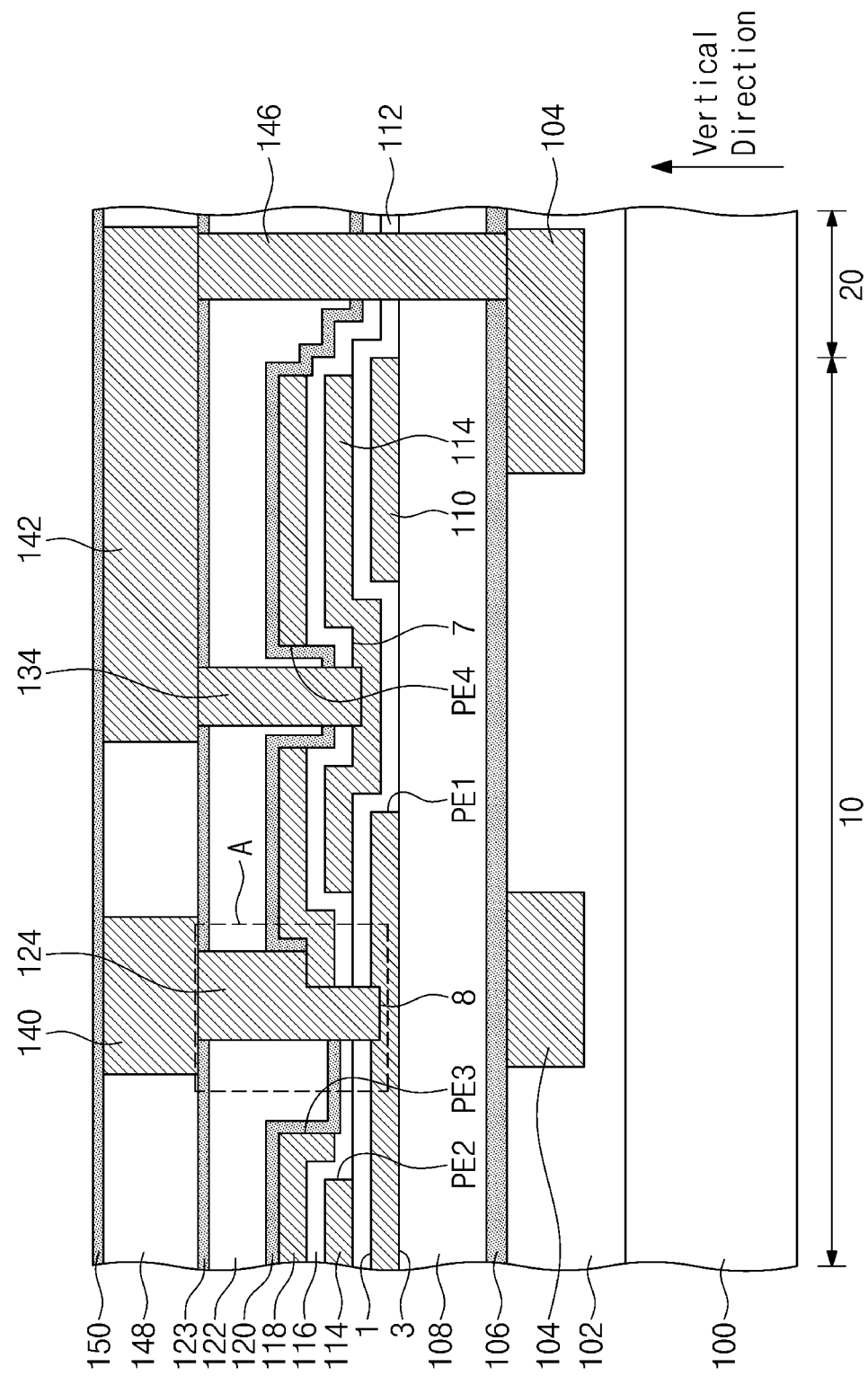
FIG. 1 illustrates a cross-sectional view showing a semiconductor device according to some example embodiments of the present inventive concepts.
Figure 2A:
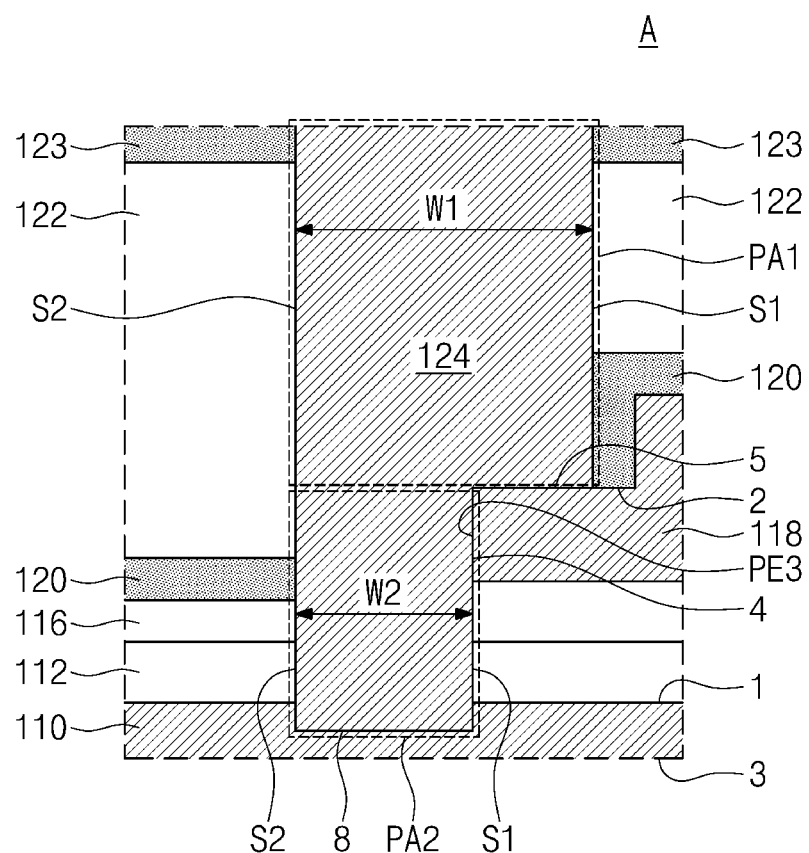
FIG. 2A illustrates an enlarged view showing section A of FIG. 1 in which a surface of a contact plug is coplanar with a top surface of a third electrode.
Figure 2B:
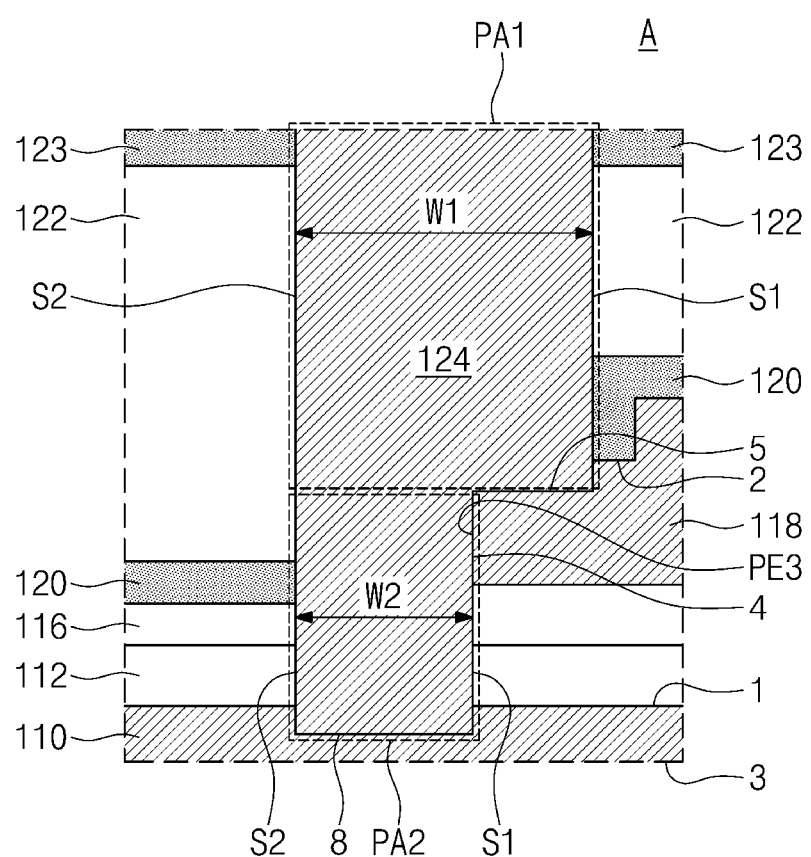
FIG. 2B illustrates an enlarged view showing section A of FIG. 1 in which a surface of a contact plug is at a lower level than a top surface of a third electrode.

FIG. 1 illustrates a cross-sectional view showing a semiconductor device according to some example embodiments of the present inventive concepts. FIG. 2A illustrates an enlarged view showing section A of FIG. 1 in which a surface of a contact plug is coplanar with a top surface of a third electrode. FIG. 2B illustrates an enlarged view showing section A of FIG. 1 in which a surface of a contact plug is at a lower level than a top surface of a third electrode.

Referring to FIG. 1, a first interlayer dielectric layer 102 may be disposed on a substrate 100. The substrate 100 may be a semiconductor substrate. For example, the substrate 100 may be a single crystalline silicon wafer and/or a silicon-on-insulator (SOI) substrate. The substrate 100 may include a first region 10 and a second region 20. For example, the first region 10 may be a device region, and the second region 20 may be a contact region. The first interlayer dielectric layer 102 may be disposed on a top surface of the substrate 100. The first interlayer dielectric layer 102 may include a dielectric material (e.g., a silicon oxide layer and/or a silicon nitride layer). Lower connection lines 104 may be disposed in the first interlayer dielectric layer 102. The lower connection lines 104 may be buried in (e.g., at least partially embedded within) the first interlayer dielectric layer 102. The top surfaces of the lower connection lines 104 may be coplanar with the top surface of the first interlayer dielectric layer 102. The lower connection lines 104 may include a metallic material (e.g., copper, aluminum, and/or tungsten). A first buffer dielectric layer 106 may be disposed on the first interlayer dielectric layer 102. The first buffer dielectric layer 106 may cover the top surface of the first interlayer dielectric layer 102 and the top surfaces of the lower connection lines 104. The first buffer dielectric layer 106 may be, for example, a silicon carbonitride (SiCN) layer. A second interlayer dielectric layer 108 may be disposed on the first buffer dielectric layer 106. The second interlayer dielectric layer 108 may cover a top surface of the first buffer dielectric layer 106. The second interlayer dielectric layer 108 may include a dielectric material (e.g., a silicon oxide layer and/or a silicon nitride layer).

A first electrode 110 may be disposed on the second interlayer dielectric layer 108. The first electrode 110 may have a first penetrating portion PE1. The first penetrating portion PE1 may be disposed on (e.g., within) the first region 10 of the substrate 100. The first penetrating portion PE1 may partially expose a top surface of the second interlayer dielectric layer 108. On the second region 20 of the substrate 100, the first electrode 110 may expose the top surface of the second interlayer dielectric layer 108. The first electrode 110 may include, for example, one or more of TaN, Ta, Al, Ti, TiN, TaSiN, WN, and/or WSiN. A first dielectric layer 112 may be disposed on the first electrode 110. The first dielectric layer 112 may cover a top surface 1 and side surfaces of the first electrode 110. The first dielectric layer 112 may lie in the first penetrating portion PE1 of the first electrode 110 and may cover the top surface of the second interlayer dielectric layer 108 (e.g., in the area in which the top surface of the second interlayer dielectric layer 108 is exposed by the first penetrating portion PE1). On the second region 20 of the substrate 100, the first dielectric layer 112 may cover the top surface of the second interlayer dielectric layer 108. The first dielectric layer 112 may have a uniform or near uniform thickness. The first dielectric layer 112 may include, for example, one or more of $Si_3N_4$, $Ta_2O_5$, $Al_2O_3$, and/or $ZrO_2$.

A second electrode 114 may be disposed on the first dielectric layer 112. The second electrode 114 may be disposed on the first region 10 of the substrate 100. The second electrode 114 may expose the first dielectric layer 112 on the second region 20 of the substrate 100. The second electrode 114 may have a second penetrating portion PE2. The second penetrating portion PE2 may partially expose a top surface of the first dielectric layer 112. The first penetrating portion PE1 of the first electrode 110 may be horizontally spaced apart from the second penetrating portion PE2 of the second electrode 114. For example, the first penetrating portion PE1 of the first electrode 110 may not vertically overlap the second penetrating portion PE2 of the second electrode 114. As depicted, the vertical direction as discussed herein is normal to the top surface of the substrate 100 such that the first interlayer dielectric layer 102 is further in the vertical direction than the substrate 100. As discussed herein, the horizontal direction is perpendicular or nearly perpendicular to the vertical direction. The second electrode 114 may include, for example, one or more of TaN, Ta, Al, Ti, TiN, TaSiN, WN, and/or WSiN.

A second dielectric layer 116 may be disposed on the second electrode 114. The second dielectric layer 116 may cover top and side surfaces of the second electrode 114. The second dielectric layer 116 may cover the first dielectric layer 112 on (e.g., within) the second region 20 of the substrate 100. The second dielectric layer 116 may cover a portion of the top surface of the first dielectric layer 112 (e.g., in the area in which the portion of the top surface of the first dielectric layer 112 is exposed by the second penetrating portion PE2 of the second electrode 114). The second dielectric layer 116 may have a uniform or near uniform thickness. The second dielectric layer 116 in the second penetrating portion PE2 of the second electrode 114 may directly contact the portion of the top surface of the first dielectric layer 112 (e.g., in the area in which the portion of the top surface of the first dielectric layer 112 is exposed to the second penetrating portion PE2 of the second electrode 114). In example embodiments, the second electrode 114 may be surrounded by the first dielectric layer 112 and the second dielectric layer 116. For example, the second dielectric layer 116 may surround (e.g., cover) the top and side surfaces of the second electrode 114. The first dielectric layer 112 may surround (e.g., be covered by) a bottom surface of the second electrode 114. The second dielectric layer 116 may include, for example, one or more of $Si_3N_4$, Ta2O5, Al2O3, and/or ZrO2.

A third electrode 118 may be disposed on the second dielectric layer 116. The third electrode 118 may be disposed on the first region 10 of the substrate 100. The third electrode 118 may include a third penetrating portion PE3 and a fourth penetrating portion PE4. The third penetrating portion PE3 may vertically overlap the second penetrating portion PE2 of the second electrode 114, and the fourth penetrating portion PE4 may vertically overlap the first penetrating portion PE1 of the first electrode 110. A portion of a top surface of the second dielectric layer 116 may be exposed to the third penetrating portion PE3. The second dielectric layer 116 may be disposed between the second electrode 114 and the third electrode 118. The fourth penetrating portion PE4 may partially expose top and side surfaces of the second dielectric layer 116. The third electrode 118 may expose the second dielectric layer 116 on the second region 20 of the substrate 100. The third electrode 118 may include, for example, one or more of TaN, Ta, Al, Ti, TiN, TaSiN, WN, and/or WSiN.

A second buffer dielectric layer 120 may be disposed on the third electrode 118. The second buffer dielectric layer 120 may cover top and side surfaces of the third electrode 118. The second buffer dielectric layer 120 may cover the top surface of the second dielectric layer 116 on the second region 20 of the substrate 100. The second buffer dielectric layer 120 may cover a portion of the top surface of the second dielectric layer 116 (e.g., in the area in which the portion of the top surface of the second dielectric layer 116 is exposed to the third penetrating portion PE3 of the third electrode 118), and also cover another portion of the top surface of the second dielectric layer 116 (e.g., in the area in which another portion of the top surface of the second dielectric layer 116 is exposed to the fourth penetrating portion PE4 of the third electrode 118). As shown in FIGS. 2A and 2B, the second buffer dielectric layer 120 may partially expose a top surface 2 of the third electrode 118 and also expose a first side surface 4 of the third electrode 118. The top surface 2 of the third electrode 118 may be disposed to vertically overlap the second penetrating portion PE2 of the second electrode 114. The first side surface 4 the third electrode 118 may correspond to a sidewall the third penetrating portion PE3 of the third electrode 118. The second buffer dielectric layer 120 may include, for example, a silicon nitride layer.

A third interlayer dielectric layer 122 may be disposed on the second buffer dielectric layer 120. The third interlayer dielectric layer 122 may cover a top surface of the second buffer dielectric layer 120. The third interlayer dielectric layer 122 may include a dielectric layer (e.g., a silicon oxide layer and/or a silicon nitride layer). A third buffer dielectric layer 123 may be disposed on the third interlayer dielectric layer 122. The third buffer dielectric layer 123 may include, for example, a silicon nitride layer.

Referring together to FIGS. 1, 2A, and 2B, a first contact plug 124 may be disposed on the first region 10 of the substrate 100. The first contact plug 124 may penetrate the third buffer dielectric layer 123, the third interlayer dielectric layer 122, the second buffer dielectric layer 120, the second dielectric layer 116, and the first dielectric layer 112. The first contact plug 124 may be disposed in the third penetrating portion PE3 of the third electrode 118 and the second penetrating portion PE2 of the second electrode 114. The first contact plug 124 may contact the first electrode 110 and the third electrode 118. The first contact plug 124 may have electrical connection with the first electrode 110 and the third electrode 118. The first contact plug 124 may contact a portion of the top surface 2 of the third electrode 118 and also contact the first side surface 4 of the third electrode 118, (e.g., the portion of the top surface 2 and the first side surface 4 that are exposed by the second buffer dielectric layer 120). The first side surface 4 of the third electrode 118 may vertically overlap the second penetrating portion PE2 of the second electrode 114. The second buffer dielectric layer 120 may cover a second side surface of the third electrode 118 (e.g., the second side surface of the third electrode 118 that overlaps the second penetrating portion PE2 of the second electrode 114 and faces the first side surface 4 of the third electrode 118). The first contact plug 124 may contact a portion of the top surface 1 of the first electrode 110. The first contact plug 124 may have a bottom surface 8 at a higher level than that of a bottom surface 3 of the first electrode 110. For example, the bottom surface 8 of the first contact plug 124 may be disposed between the top and bottom surfaces 1 and 3 of the first electrode 110.

The first contact plug 124 may include a first segment PA1 and a second segment PA2 respectively above and below the top surface 2 of the third electrode 118 overlapping the second penetrating portion PE2 of the second electrode 114. The first segment PA1 may include a surface 5 exposed by the second segment PA2, and the second segment PA2 may extend toward the first electrode 110 from the surface 5 of the first segment PAL The first segment PA1 may have a width W1 greater than a width W2 of the second segment PA2 (W1>W2). The first contact plug 124 may include a first side surface S1 and a second side surface S2. The first side surface S1 and the second side surface S2 may face each other. In example embodiments, the first side surface S1 of the first segment PA1 of the first contact plug 124 may not be aligned (e.g., may vary horizontally) with the first side surface S1 of the second segment PA2 of the first contact plug 124. The surface 5 of the first segment PA1 may connect the first side surface S1 of the first segment PA1 to the first side surface S1 of the second segment PA2. In example embodiments, the second side surface S2 of the first segment PA1 of the first contact plug 124 may be aligned with the second side surface S2 of the second segment PA2 of the first contact plug 124. The first contact plug 124 may have, for example, an L shape. As shown in FIG. 2A, the surface 5 of the first segment PA1 may be coplanar with other portion of the top surface 2 of the third electrode 118, which other portion overlaps the third penetrating portion PE3 and is covered with the second buffer dielectric layer 120. As shown in FIG. 2B, the surface 5 of the first segment PA1 may be located at a lower level than that of other portion of the top surface 2 of the third electrode 118, which other portion is covered with the second buffer dielectric layer 120.

According to some example embodiments of the present inventive concepts, there may be provided a metal-insulator-metal (MIM) capacitor including three electrodes. Accordingly, the capacitor may increase in capacitance.

According to some example embodiments of the present inventive concepts, the first contact plug 124 may contact two electrodes, for example, the first electrode 110 and the third electrode 118, and may penetrate the third electrode 118 while contacting the first side surface 4 and a portion of the top surface 2 of the third electrode 118. In this configuration, an increased contact area may be provided between the first contact plug 124 and the third electrode 118, which may result in a reduction in resistance. In conclusion, the capacitor may have an increased capacitance (e.g., due to the reduction in resistance).

A second contact plug 134 may be disposed on the first region 10 of the substrate 100. The second contact plug 134 may penetrate the third buffer dielectric layer 123, the third interlayer dielectric layer 122, the second buffer dielectric layer 120, and the second dielectric layer 116, contacting the second electrode 114. The second contact plug 134 may be electrically connected to the second electrode 114. The second contact plug 134 may be disposed in the fourth penetrating portion PE4 of the third electrode 118. The second contact plug 134 may recess a top surface 7 of the second electrode 114 on the first dielectric layer 112 (e.g., the top surface 7 of the second electrode 114 that overlaps the first penetrating portion PE1 of the first electrode 110). The first contact plug 124 and the second contact plug 134 may include a metallic material (e.g., copper, tungsten, and/or aluminum).

A first upper connection line 140 and a second upper connection line 142 may be disposed on the third buffer dielectric layer 123. The first upper connection line 140 may be disposed on the first contact plug 124, and the second upper connection line 142 may be disposed on the second contact plug 134. The first upper connection line 140 may be electrically connected to the first contact plug 124, and the second upper connection line 142 may be electrically connected to the second contact plug 134. The first upper connection line 140 and the second upper connection line 142 may include a metallic material (e.g., copper, tungsten, and/or aluminum). A through plug 146 may be disposed on the second region 20 of the substrate 100. The through plug 146 may penetrate the first buffer dielectric layer 106, the second interlayer dielectric layer 108, the first dielectric layer 112, the second dielectric layer 116, the second buffer dielectric layer 120, the third interlayer dielectric layer 122, and the third buffer dielectric layer 123, connecting at least one of the lower connection lines 104 to the second upper connection line 142. The through plug 146 may include a metallic material (e.g., copper, tungsten, and/or aluminum). In example embodiments, the first contact plug 124 may be supplied with a first voltage V1, and the second contact plug 134 may be electrically grounded. The first voltage V1 may be applied to the first contact plug 124 through a third upper connection line (not shown) that is provided on the fourth buffer dielectric layer 150 and that is connected to the first upper connection line 140. The second contact plug 134 may be electrically grounded to one of the lower connection lines 104 that is connected through the through plug 146 to the second upper connection line 142.

A fourth interlayer dielectric layer 148 may be disposed on side surfaces of the first and second upper connection lines 140 and 142. The fourth interlayer dielectric layer 148 may include a dielectric material (e.g., a silicon oxide layer and/or a silicon nitride layer). A fourth buffer dielectric layer 150 may be disposed on the fourth interlayer dielectric layer 148. The fourth buffer dielectric layer 150 may cover a top surface of the fourth interlayer dielectric layer 148 and/or top surfaces of the first and second upper connection lines 140 and 142. The fourth buffer dielectric layer 150 may include, for example, a silicon nitride layer.

Figure 3:
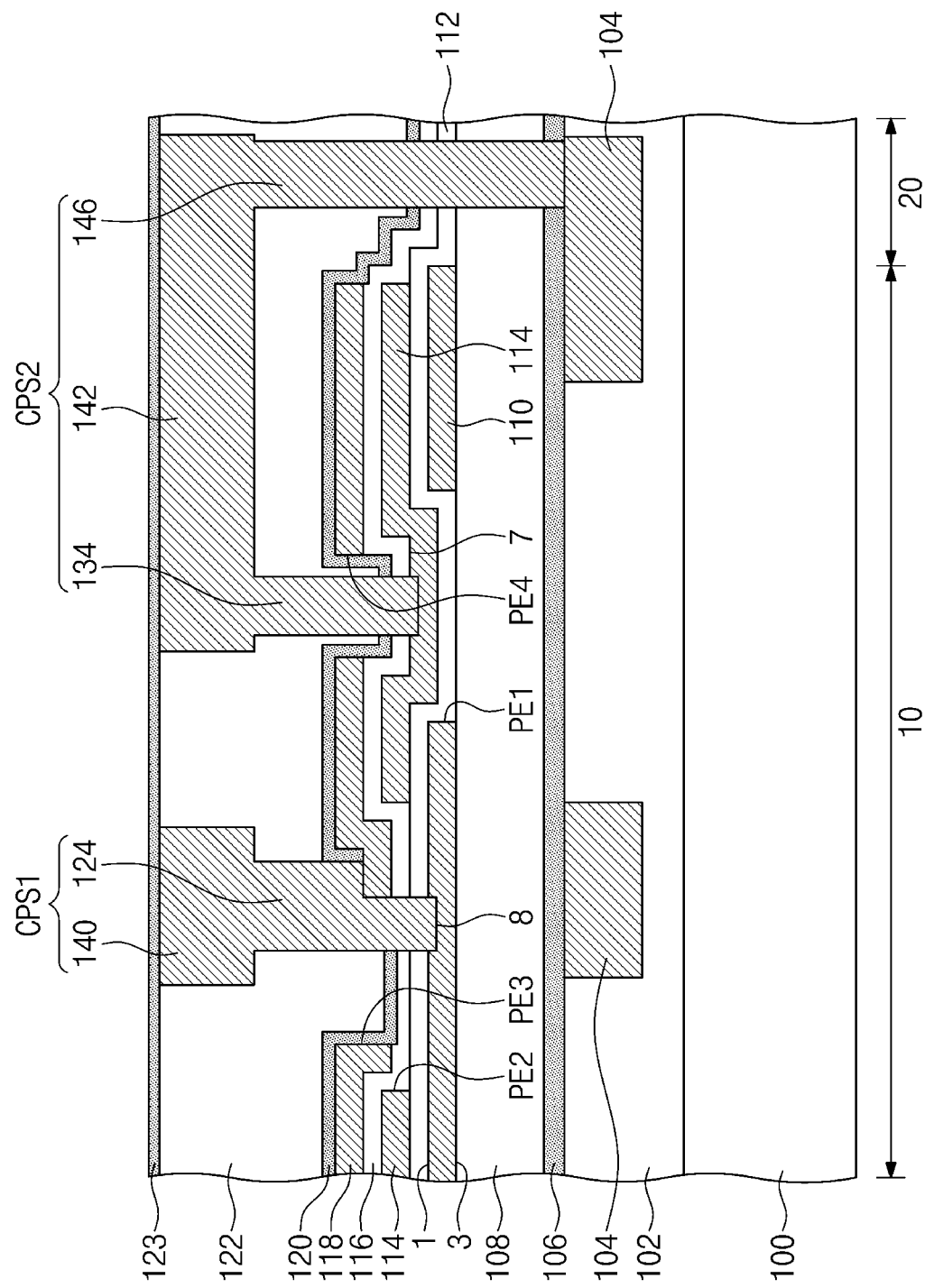
FIG. 3 illustrates a cross-sectional view showing a semiconductor device including first and second contact plug structures in the third interlayer dielectric layer, according to some example embodiments of the present inventive concepts.

FIG. 3 illustrates a cross-sectional view showing a semiconductor device including first and second contact plug structures in the third interlayer dielectric layer, according to some example embodiments of the present inventive concepts. For brevity of description, components similar or the same as those of the semiconductor device discussed above are allocated the same reference numerals thereto, and a detailed explanation thereof will be omitted.

Referring to FIG. 3, a first contact plug structure CPS1 may be disposed in the third interlayer dielectric layer 122. The first contact plug structure CPS1 may include the first contact plug 124, in contact with the first electrode 110 and the third electrode 118, and the first upper connection line 140 on the first contact plug 124. In example embodiments, the first contact plug 124 and the first upper connection line 140 may be provided as a single body. A second contact plug structure CPS2 may be disposed in the third interlayer dielectric layer 122. The second contact plug structure CPS2 may include the second contact plug 134, the second upper connection line 142, and the through plug 146. The second contact plug 134 may be disposed on the first region 10 of the substrate 100 and may be in contact with the second electrode 114. The second upper connection line 142 may be disposed on the second contact plug 134. The through plug 146 may be disposed on the second region 20 of the substrate 100. The through plug 146 may connect the second upper connection line 142 to at least one of the lower connection lines 104. In example embodiments, the second contact plug 134, the second upper connection line 142, and the through plug 146 may be provided as a single body.

The third buffer dielectric layer 123 may be disposed on the third interlayer dielectric layer 122. The third buffer dielectric layer 123 may cover a top surface of the first contact plug structure CPS1, a top surface of the second contact plug structure CPS2, and a top surface of the third interlayer dielectric layer 122. For example, an example embodiment may include neither the fourth interlayer dielectric layer 148 nor the fourth buffer dielectric layer 150 that are shown in FIG. 2.

Figure 4:
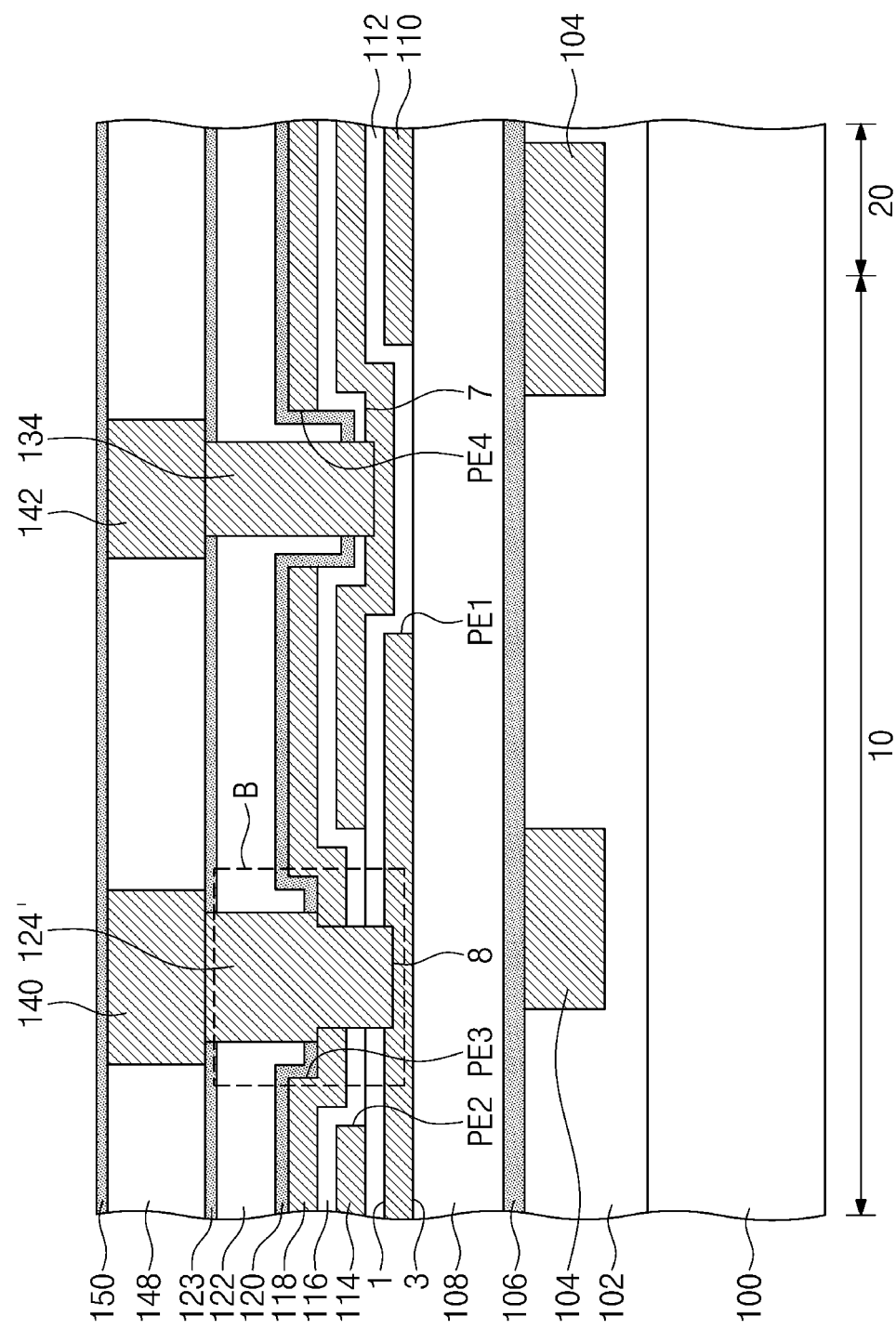
FIG. 4 illustrates a cross-sectional view showing a semiconductor device including a T shaped contact plug, according to some example embodiments of the present inventive concepts.
Figure 5A:
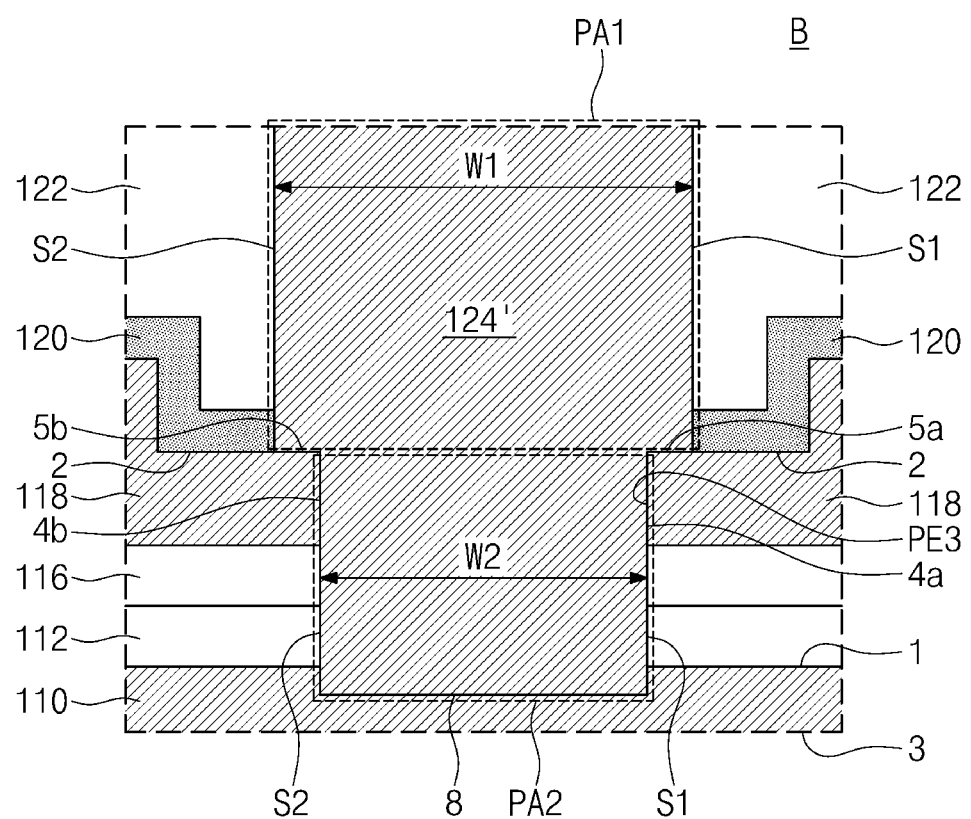
FIG. 5A illustrates an enlarged view showing section B of FIG. 4 in which a surface of the T shaped contact plug is coplanar with a top surface of a third electrode.
Figure 5B:
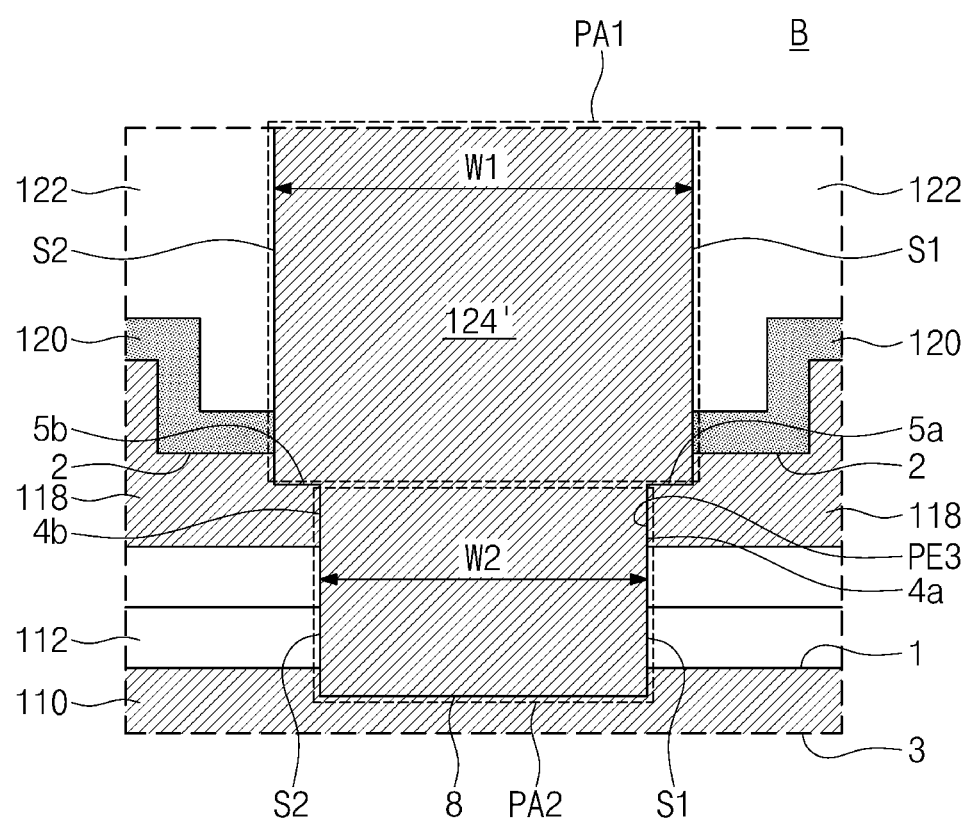
FIG. 5B illustrates an enlarged view showing section B of FIG. 4 in which a surface of the T shaped contact plug is at a lower level than a top surface of a third electrode.

FIG. 4 illustrates a cross-sectional view showing a semiconductor device including a T shaped contact plug, according to some example embodiments of the present inventive concepts. FIG. 5A illustrates an enlarged view showing section B of FIG. 4 in which a surface of the T shaped contact plug is coplanar with a top surface of a third electrode. FIG. 5B illustrates an enlarged view showing section B of FIG. 4 in which a surface of the T shaped contact plug is at a lower level than a top surface of a third electrode. For brevity of description, components similar or the same as those of the semiconductor device discussed above are allocated the same reference numerals thereto, and a detailed explanation thereof will be omitted.

Referring to FIGS. 4, 5A, and 5B, the first electrode 110, the second electrode 114, and the third electrode 118 may extend onto the second region 20 of the substrate 100. In example embodiments, the first and second regions 10 and 20 of the substrate 100 may all be a semiconductor device region. Although not shown, the first upper connection line 140 may be electrically connected to a third upper connection line (not shown) on the fourth buffer dielectric layer 150. The second upper connection line 142 may be connected to a fourth upper connection line (not shown) on the fourth buffer dielectric layer 150, and the fourth upper connection line (not shown) and one of the lower connection lines 104 may be connected to each other through a through plug (not shown). For example, one of the lower connection lines 104 may be connected to the second contact plug 134 though the second upper connection line 142, the fourth upper connection line (not shown), and the through plug (not shown).

A first contact plug 124' may include a first segment PA1 having a first surface 5a and a second surface 5b. The first surface 5a and the second surface 5b may be parallel or nearly parallel to the top surface of the substrate 100. The first surface 5a and the second surface 5b may be laterally disposed across (e.g., extend laterally from) a second segment PA2 of the first contact plug 124'. The second segment PA2 of the first contact plug 124' may extend toward the first electrode 110 from the first and second surfaces 5a and 5b of the first segment PAL The first surface 5a and the second surface 5b may contact the third electrode 118 exposed by the second buffer dielectric layer 120.

A first side surface S1 of the first segment PA1 of the first contact plug 124' may not be aligned with a first side surface S1 of the second segment PA2 of the first contact plug 124'. The first surface 5a of the first segment PA1 may connect the first side surface S1 of the first segment PA1 to the first side surface S1 of the second segment PA2. A second side surface S2 of the first segment PA1 of the first contact plug 124' may not be aligned with a second side surface S2 of the second segment PA2 of the first contact plug 124'. The second surface 5b of the first segment PA1 may connect the second side surface S2 of the first segment PA1 to the second side surface S2 of the second segment PA2. For example, the first contact plug 124' may have a T shape. The first contact plug 124' may contact first and second side surfaces 4a and 4b of the third electrode 118. The first and second side surfaces 4a and 4b of the third electrode 118 may face each other. The first side surface 4a and the second side surface 4b may be exposed by the second buffer dielectric layer 120. The first side surface 4a and the second side surface 4b may vertically overlap the second penetrating portion PE2 of the second electrode 114.

As shown in FIG. 5A, the first surface 5a of the first contact plug 124' may be in contact with a portion of the top surface 2 of the third electrode 118 and may be coplanar with another portion of the top surface 2 of the third electrode 118 covered with the second buffer dielectric layer 120. The second surface 5b of the first contact plug 124' may be in contact with a portion of the top surface 2 of the third electrode 118 and may be coplanar with the other portion of the top surface 2 of the third electrode 118 covered with the second buffer dielectric layer 120. As shown in FIG. 5B, the first surface 5a of the first contact plug 124' may be in contact with a portion of the top surface 2 of the third electrode 118 and may be located at a lower level than that of the other portion of the top surface 2 of the third electrode 118 covered with the second buffer dielectric layer 120. The second surface 5b of the first contact plug 124' may be in contact with a portion of the top surface 2 of the third electrode 118 and may be located at a lower level than that of the other portion of the top surface 2 of the third electrode 118 covered with the second buffer dielectric layer 120.

Figure 6:
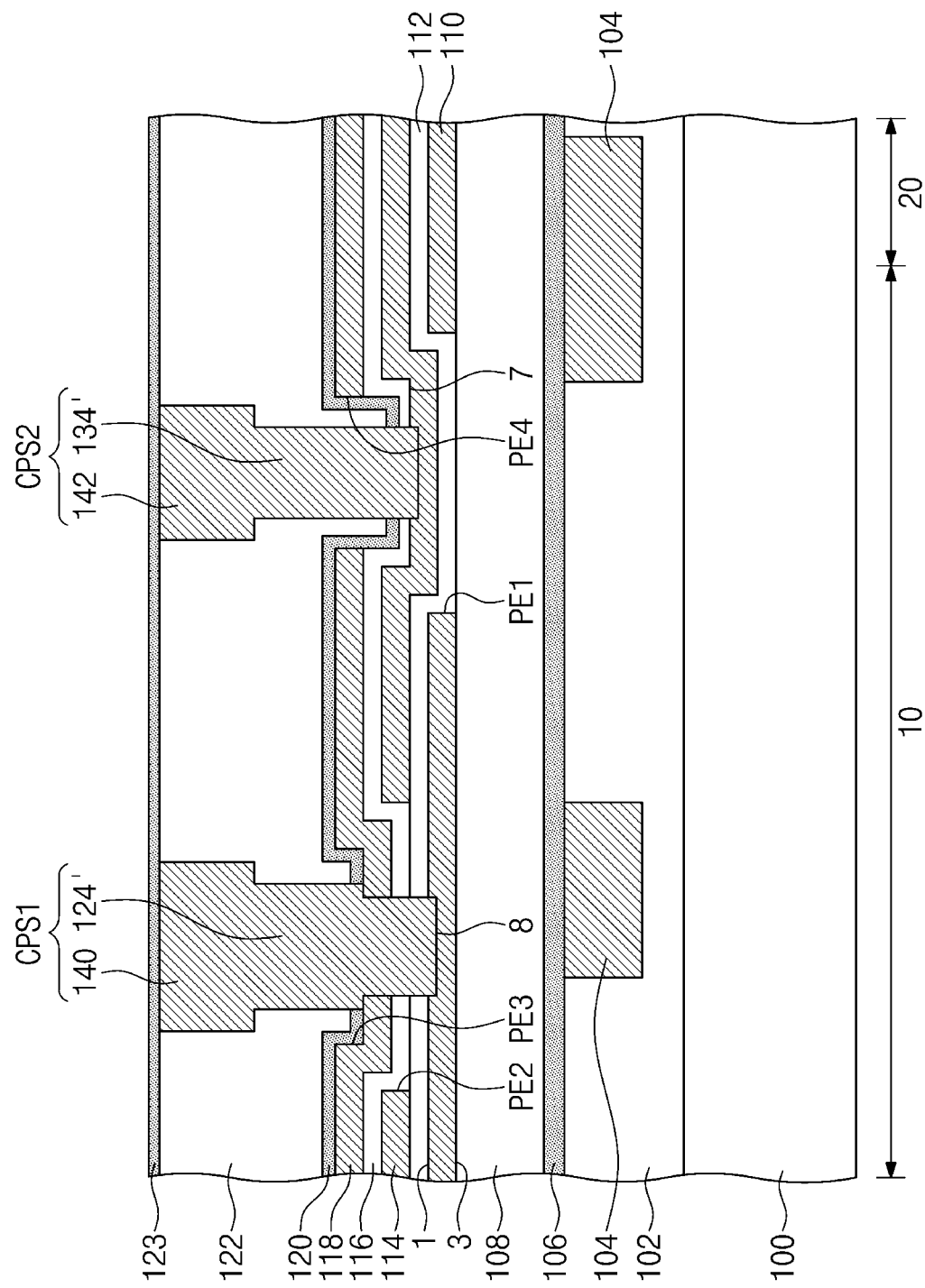
FIG. 6 illustrates a cross-sectional view showing a semiconductor device including a T shaped contact plug, and first and second contact plug structures in the third interlayer dielectric layer, according to some example embodiments of the present inventive concepts.

FIG. 6 illustrates a cross-sectional view showing a semiconductor device according to some example embodiments of the present inventive concepts. For brevity of description, components similar or the same as those of the semiconductor device discussed above are allocated the same reference numerals thereto, and a detailed explanation thereof will be omitted.

Referring to FIG. 6, a first contact plug structure CPS1 may be disposed in the third interlayer dielectric layer 122. The first contact plug structure CPS1 may include a first contact plug 124', in contact with the first electrode 110 and the third electrode 118, and the first upper connection line 140 on the first contact plug 124'. In example embodiments, the first contact plug 124' and the first upper connection line 140 may be provided as a single body. A second contact plug structure CSP2 may be disposed in the third interlayer dielectric layer 122. The second contact plug CPS2 may include a second contact plug 134' and the second upper connection line 142. In example embodiments, the second contact plug 134' and the second upper connection line 142 may be provided as a single body.

FIGS. 7A to 7G illustrate cross-sectional views showing a method of fabricating a semiconductor device according to some example embodiments of the present inventive concepts.

Figure 7A:
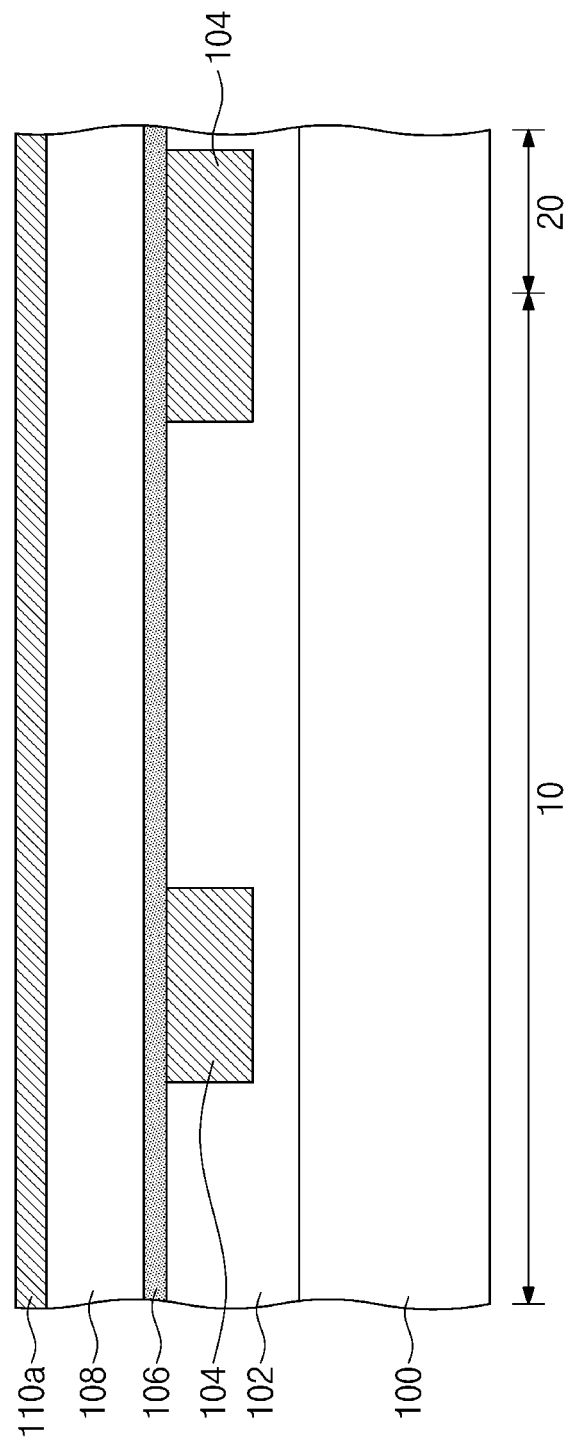

Referring to FIG. 7A, a first interlayer dielectric layer 102 may be formed on a substrate 100. The substrate 100 may include a first region 10 and a second region 20. The first interlayer dielectric layer 102 may be formed on a top surface of the substrate 100. Lower connection lines 104 may be formed in the first interlayer dielectric layer 102. The lower connection lines 104 may be buried in the first interlayer dielectric layer 102. The lower connection lines 104 may have their top surfaces coplanar with that of the first interlayer dielectric layer 102.

A first buffer dielectric layer 106 may be formed on the first interlayer dielectric layer 102. The first buffer dielectric layer 106 may cover the top surface of the first interlayer dielectric layer 102 and the top surfaces of the lower connection lines 104. The first buffer dielectric layer 106 may include a material having an etch selectivity with respect to the first interlayer dielectric layer 102. A second interlayer dielectric layer 108 may be formed on the first buffer dielectric layer 106. The second interlayer dielectric layer 108 may include a material having an etch selectivity with respect to the first buffer dielectric layer 106. A first electrode layer 110a may be formed on the second interlayer dielectric layer 108. The first electrode layer 110a may be formed on the first and second regions 10 and 20 of the substrate 100. The first electrode layer 110a may include, for example, one or more of TaN, Ta, Al, Ti, TiN, TaSiN, WN, and/or WSiN.

Figure 7B:
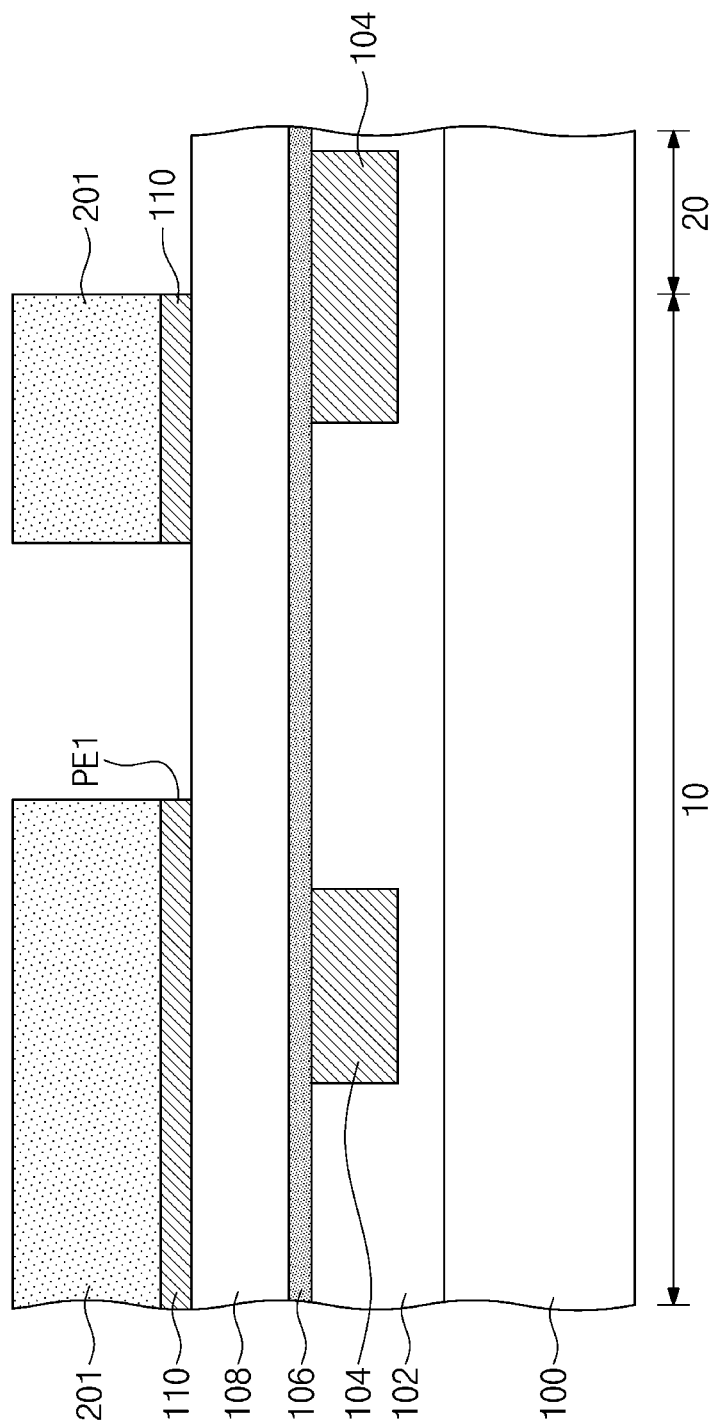

Referring to FIG. 7B, the first electrode layer 110a may be patterned to form a first electrode 110. The formation of the first electrode 110 may include forming a first mask pattern 201 on the first electrode layer 110a and performing a patterning process in which the first mask pattern 201 is used as an etching mask to pattern the first electrode layer 110a. The patterning process may form a first penetrating portion PE1 in the first electrode 110. The first penetrating portion PE1 may be formed on the first region 10 of the substrate 100. The first penetrating portion PE1 may partially expose a top surface of the second interlayer dielectric layer 108. Due to the patterning process, the first electrode layer 110a may be etched on the portion of the first electrode layer 110a formed on the second region 20 of the substrate 100. Thus, the top surface of the second interlayer dielectric layer 108 may be exposed on the portion of the second interlayer dielectric layer 108 formed on the second region 20 of the substrate 100. The patterning process may be, for example, a dry etching process. The first mask pattern 201 may be, for example, a photoresist pattern. After the patterning process, the first mask pattern 201 may be removed by an ashing process and/or a strip process.

Figure 7C:
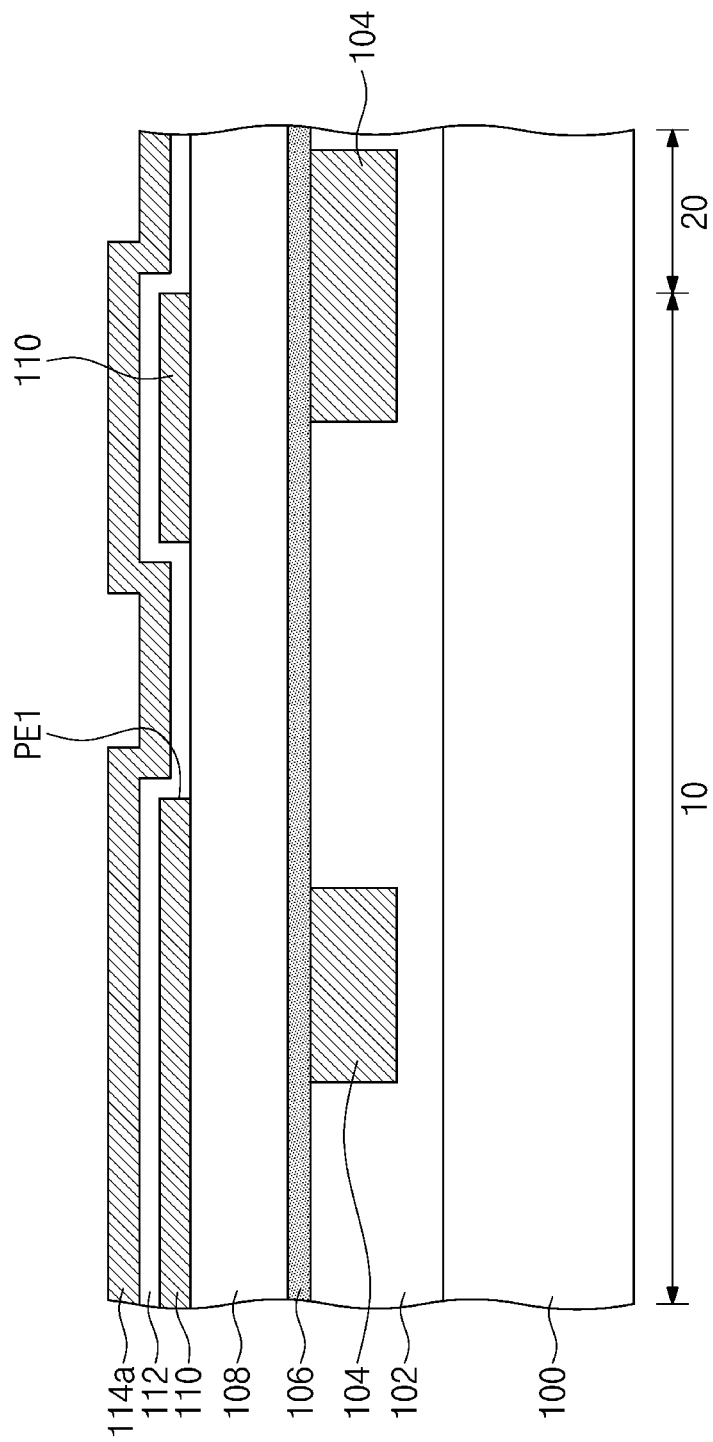

Referring to FIG. 7C, a first dielectric layer 112 may be formed on the first electrode 110. The first dielectric layer 112 may cover top and side surfaces of the first electrode 110, the top surface of the second interlayer dielectric layer 108 on the second region 20 of the substrate 100, and a portion of the second interlayer dielectric layer 108, exposed to (e.g., exposed by) the first penetrating portion PE1 of the first electrode 110. The first dielectric layer 112 may be conformally formed on the first electrode 110 and portions of the second interlayer dielectric layer 108. For example, the first dielectric layer 112 may be formed with respect to the exposed top and side portions of both the first electrode 110 and the second interlayer dielectric layer 108 such that the first dielectric layer 112 covers the exposed top and side portions of both the first electrode 110 and the second interlayer dielectric layer 108. A second electrode layer 114a may be formed on the first dielectric layer 112. The second electrode layer 114a may conformally cover top and side surfaces of the first dielectric layer 112. The second electrode layer 114a may include, for example, one or more of TaN, Ta, Al, Ti, TiN, TaSiN, WN, and/or WSiN.

Figure 7D:
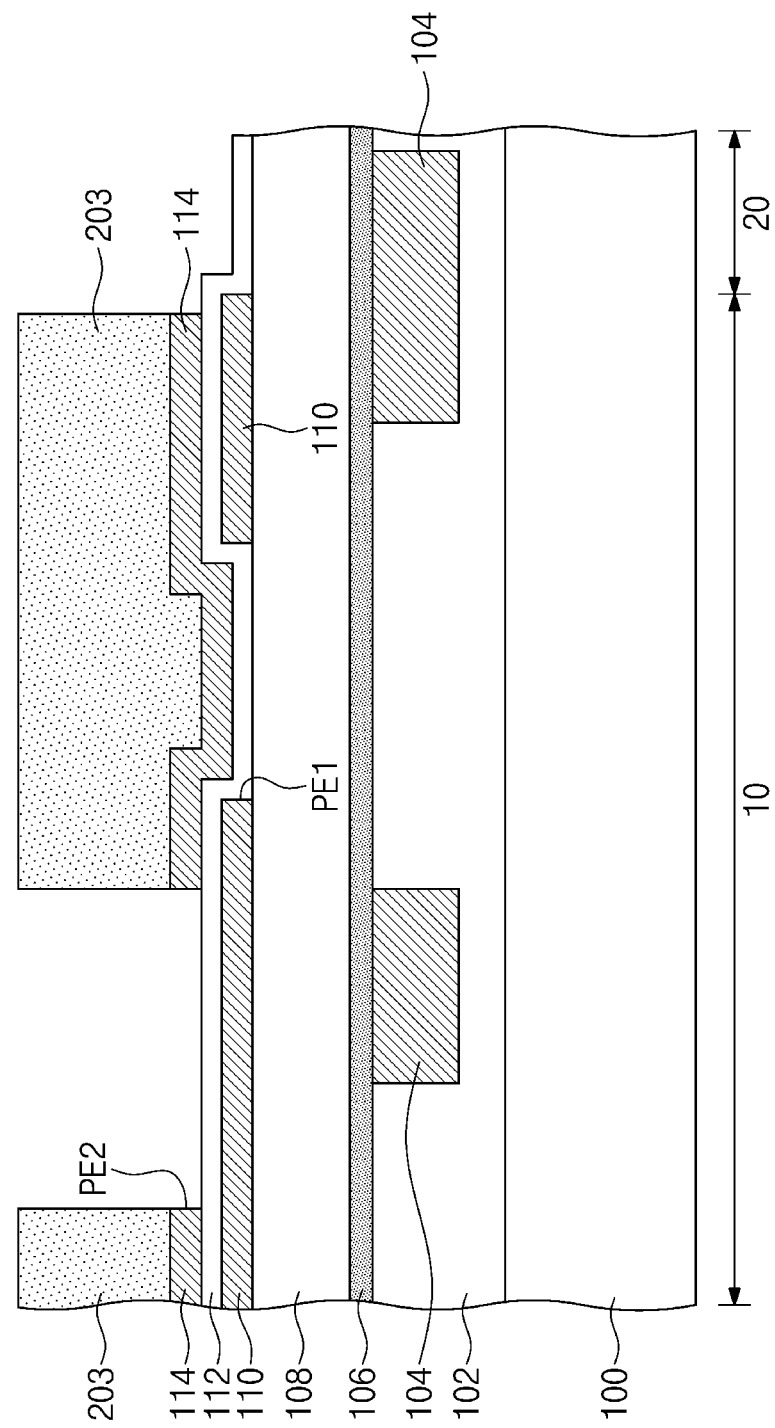

Referring to FIG. 7D, the second electrode layer 114a may be patterned to form a second electrode 114. The formation of the second electrode 114 may include forming a second mask pattern 203 on the second electrode layer 114a and performing a patterning process in which the second mask pattern 203 is used as an etching mask to pattern the second electrode layer 114a. The patterning process may form a second penetrating portion PE2 in the second electrode 114. The second penetrating portion PE2 may be formed on the first region 10 of the substrate 100. The second penetrating portion PE2 may expose a portion of the top surface of the first dielectric layer 112. The second penetrating portion PE2 of the second electrode 114 may be horizontally spaced apart from the first penetrating portion PE1 of the first electrode 110. For example, the second penetrating portion PE2 of the second electrode 114 may be formed not to vertically overlap the first penetrating portion PE1 of the first electrode 110. The patterning process may remove the second electrode layer 114a formed on the second region 20 of the substrate 100, and thus the top surface of the first dielectric layer 112 may be partially exposed. The patterning process may be, for example, a dry etching process. The second mask pattern 203 may be, for example, a photoresist pattern. After the patterning process, the second mask pattern 203 may be removed by an ashing process and/or a strip process.

Figure 7E:
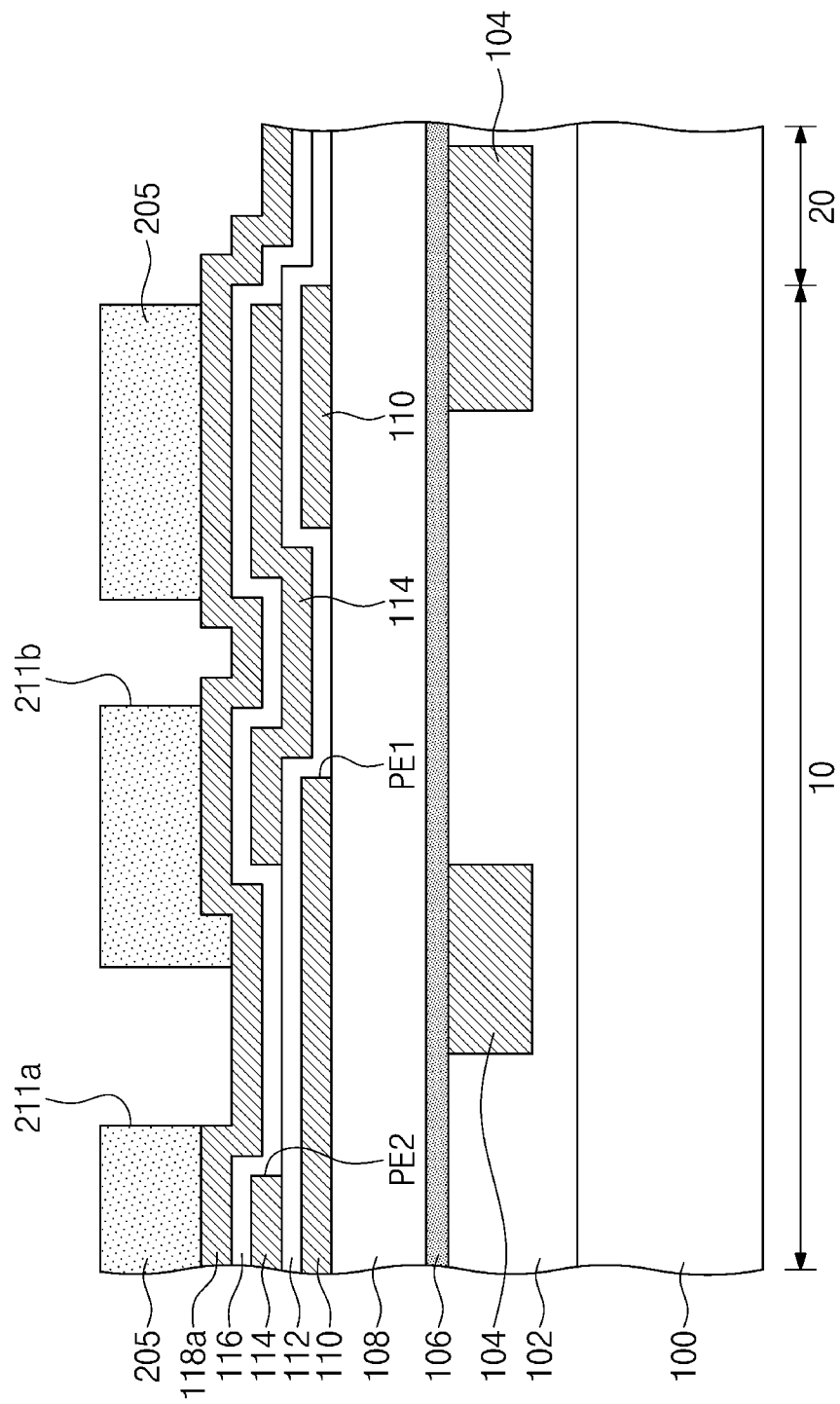

Referring to FIG. 7E, a second dielectric layer 116 may be formed on the second electrode 114. The second dielectric layer 116 may cover top and side surfaces of the second electrode 114. The second dielectric layer 116 may cover a portion of the top surface of the first dielectric layer 112 (e.g., the portion of the top surface of the first dielectric layer 112 exposed to the second penetrating portion PE2 of the second electrode 114), and also cover another portion of the top surface of the first dielectric layer 112 (the portion of the top surface of the first dielectric layer 112 formed on the second region 20 of the substrate 100). The second dielectric layer 116 may be conformally formed on the second electrode 114 and portions of the top surface of the first dielectric layer 112. A third electrode layer 118a may be formed on the second dielectric layer 116. The third electrode layer 118a may be conformally formed on the second dielectric layer 116. The third electrode layer 118a may include, for example, one or more of TaN, Ta, Al, Ti, TiN, TaSiN, WN, and/or WSiN.

A third mask pattern 205 may be formed on the third electrode layer 118a. The third mask pattern 205 may include a first opening 211a and a second opening 211b. The first opening 211a and the second opening 211b may be disposed on the first region 10 of the substrate 100. The first opening 211a may be disposed to vertically overlap the second penetrating portion PE2 of the second electrode 114, and the second opening 211b may be disposed to vertically overlap the first penetrating portion PE1 of the first electrode 110. The first and second openings 211a and 211b may partially expose a top surface of the third electrode layer 118a. The third mask pattern 205 may partially expose the top surface of the third electrode layer 118a formed on the second region 20 of the substrate 100. The third mask pattern 205 may be, for example, a photoresist pattern.

Referring to FIG. 7F, a patterning process may be performed in which the third mask pattern 205 is used as an etching mask to pattern the third electrode layer 118a to form a third electrode 118. The patterning process may form a third penetrating portion PE3 and a fourth penetrating portion PE4 in the third electrode 118. The third and fourth penetrating portions PE3 and PE4 may expose portions of a top surface of the second dielectric layer 116. The third penetrating portion PE3 may be formed to vertically overlap the second penetrating portion PE2 of the second electrode 114, and the fourth penetrating portion PE4 may be formed to vertically overlap the first penetrating portion PE1 of the first electrode 110. The patterning process may at least partially expose the top surface of the second dielectric layer 116 formed on the second region 20 of the substrate 100. After the patterning process, the third mask pattern 205 may be removed by an ashing process and/or a strip process.

Referring to FIG. 7G, a second buffer dielectric layer 120 may be formed on the third electrode 118. The second buffer dielectric layer 120 may conformally cover top and side surfaces of the third electrode 118. The second buffer dielectric layer 120 may conformally cover a portion of the top surface of the second dielectric layer 116 (e.g., the portion of the top surface of the second dielectric layer 116 exposed to the third penetrating portion PE3 of the third electrode 118), and also conformally cover another portion of the top surface of the second dielectric layer 116 (e.g., the portion of the top surface of the second dielectric layer 116 exposed to the fourth penetrating portion PE4 of the third electrode 118. The second buffer dielectric layer 120 may conformally cover a portion of the top surface of the second dielectric layer 116 formed on the second region 20 of the substrate 100. The second buffer dielectric layer 120 may include a material having an etch selectivity with respect to the first, second, and third electrodes 110, 114, and 118. The second buffer dielectric layer 120 may include, for example, a silicon nitride layer.

A third interlayer dielectric layer 122 may be formed on the second buffer dielectric layer 120. The third interlayer dielectric layer 122 may cover a top surface of the second buffer dielectric layer 120. A third buffer dielectric layer 123 may be formed on the third interlayer dielectric layer 122. The third buffer dielectric layer 123 may cover a top surface of the third interlayer dielectric layer 122. A fourth mask pattern 207 may be formed on the third buffer dielectric layer 123. The fourth mask pattern 207 may include a first opening 213a, a second opening 213b, and a third opening 213c. The first and second openings 213a and 213b may be formed on the first region 10 of the substrate 100, and the third opening 213c may be formed on the second region 20 of the substrate 100. The first opening 213a may vertically overlap the second penetrating portion PE2 of the second electrode 114 and the third penetrating portion PE3 of the third electrode 118, and the second opening 213b may vertically overlap the first penetrating portion PE1 of the first electrode 110. The third opening 213c may vertically overlap one of the lower connection lines 104. The fourth mask pattern 207 may be, for example, a photoresist pattern.

An etching process may be performed in which the fourth mask pattern 207 is used as an etching mask to etch the third buffer dielectric layer 123, the third interlayer dielectric layer 122, the second buffer dielectric layer 120, the second dielectric layer 116, and the first dielectric layer 112. The etching process may form a first through hole H1, a second through hole H2, and a third through hole H3 in the third interlayer dielectric layer 122. With respect to the third through hole H3, the etching process may also etch the second interlayer dielectric layer 108 and the first buffer dielectric layer 106. The first through hole H1 may expose a portion of the top surface of the first electrode 110 vertically overlapping the second penetrating portion PE2 of the second electrode 114, and also expose a first side surface 4 and a portion of the top surface of the third electrode 118 vertically overlapping the second penetrating portion PE2 of the second electrode 114. The second through hole H2 may expose a portion of the top surface of the second electrode 114 vertically overlapping the first penetrating portion PE1 of the first electrode 110. The third through hole H3 may partially expose a top surface of one of the lower connection lines 104. The etching process may use an etch recipe that may etch the third interlayer dielectric layer 122, the second and third buffer dielectric layers 120 and 123, and the first and second dielectric layers 112 and 116, which etch recipe may have an etch selectivity with respect to the first, second, and third electrodes 110, 114, and 118. In some example embodiments, the etching process may use an etch recipe that may also etch the second interlayer dielectric layer 108 and the first buffer dielectric layer 106 and have an etch selectivity with respect to the first, second, and third electrodes 110, 114, and 118. Thus, when the first through hole H1 is formed until a portion of the top surface of the first electrode 110 is exposed, the third electrode 118 may not be etched on its portion exposed to the first through hole H1. In addition, when the third through hole H3 is formed until one of the lower connection lines 104 is exposed on its top surface, no etching may be performed on a portion of the top surface of the first electrode 110 exposed to the first through hole H1 and a portion of the top surface of the second electrode 114 exposed to the second through hole H2. The etching process may recess a portion of the top surface of the first electrode 110, which portion is exposed to the first opening 213a, and also recess a portion of the top surface of the second electrode 114, which portion is exposed to the second through hole H2. The etching process may be, for example, a dry etching process. In example embodiments, the etching process may recess a portion of the top surface 2 of the third electrode 118, which portion is exposed to the first opening 213a.

After the first, second, and third through holes H1, H2, and H3 are formed, the fourth mask pattern 207 may be removed. For example, the fourth mask pattern 207 may be removed by an ashing process and/or a strip process.

Referring back to FIG. 1, a first contact plug 124, a second contact plug 134, and a through plug 146 may be formed. The first contact plug 124 may be formed in the first through hole H1, the second contact plug 134 may be formed in the second through hole H2, and the through plug 146 may be formed in the third through hole H3. The formation of the plugs 124, 134, and 146 may include forming a metal layer (not shown) to cover a top surface of the third buffer dielectric layer 123 and to at least partially fill the first, second, and third contact holes H1, H2, and H3, and then performing a planarization process until the top surface of the third buffer dielectric layer 123 is exposed.

A fourth interlayer dielectric layer 148, a first upper connection line 140, and a second upper connection line 142 may be formed on the third buffer dielectric layer 123. The first upper connection line 140 may be formed on the first contact plug 124, and the second upper connection line 142 may be formed on the second contact plug 134 and the through plug 146. The second upper connection line 142 may be formed between the second contact plug 134 and the through plug 146. The fourth interlayer dielectric layer 148 may be formed on the third buffer dielectric layer 123 and may cover side surfaces of the first and second upper connection lines 140 and 142. A fourth buffer dielectric layer 150 may be formed on the fourth interlayer dielectric layer 148. The fourth buffer dielectric layer 150 may cover top surfaces of the first and second upper connection lines 140 and 142.

Figure 8:
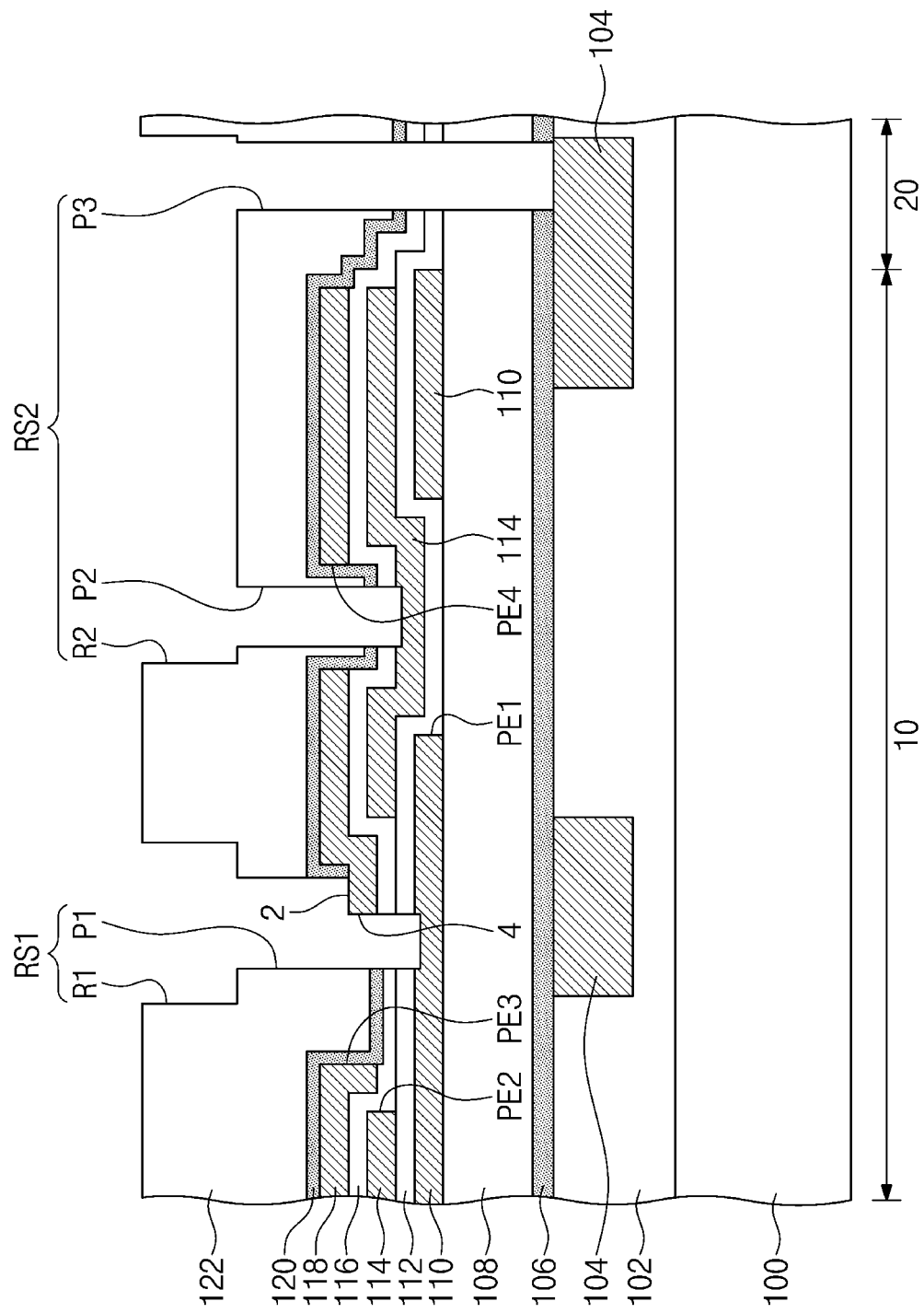
FIG. 8 illustrates a cross-sectional view showing a method of fabricating a semiconductor device including first and second contact plug structures in the third interlayer dielectric layer, according to some example embodiments of the present inventive concepts.

FIG. 8 illustrates a cross-sectional view showing a method of fabricating a semiconductor device including first and second contact plug structures in the third interlayer dielectric layer, according to some example embodiments of the present inventive concepts.

Referring to FIG. 8, a first recess structure RS1 and a second recess structure RS2 may be formed in the third interlayer dielectric layer 122. The first recess structure RS1 and the second recess structure RS2 may be formed on the first region 10 of the substrate 100, and the second recess structure RS2 may be formed on the second region 20 of the substrate 100. The first recess structure RS1 may penetrate a portion of the second buffer dielectric layer 120 and also penetrate the first and second dielectric layers 112 and 116. The first recess structure RS1 may expose a portion of the top surface of the first electrode 110 and also expose the first side surface 4 and a portion of the top surface 2 of the third electrode 118 vertically overlapping the second penetrating portion PE2 of the second electrode 114. The second recess structure RS2 may penetrate a portion of the second buffer dielectric layer 120 and the second dielectric layer 116 and may expose a portion of the top surface of the second electrode 114 vertically overlapping the first penetrating portion PE1 of the first electrode 110.

The first recess structure RS1 may include a first hole P1 and a first recess R1. The first recess R1 may be formed on the first hole P1. The first hole P1 may be formed to have a width less than that of the first recess R1. The first hole P1 and the first recess R1 may be spatially connected to each other. The second recess structure RS2 may include a second hole P2, a third hole P3, and a second recess R2. The second recess R2 may be formed on the second hole P2 and the third hole P3. The second hole P2 may be formed on the first region 10 of the substrate 100, the third hole P3 may be formed on the second region 20 of the substrate 100, and the second recess R2 may be formed on the first and second regions 10 and 20 of the substrate 100. The second hole P2, the third hole P3, and the second recess R2 may be spatially connected to each other. The third hole P3 of the second recess structure RS2 may also penetrate the second interlayer dielectric layer 108 and the first buffer dielectric layer 106.

In example embodiments, a dual damascene process may be performed to form the first recess structure RS1 and the second recess structure RS2. For example, the formation of the first and second recess structures RS1 and RS2 may include forming a first photoresist pattern (not shown) on the third interlayer dielectric layer 122, using the first photoresist pattern as an etching mask to etch the third interlayer dielectric layer 122 (and the first and second dielectric layers 112 and 116, the second interlayer dielectric layer 108 and the first buffer dielectric layer 106, as discussed above) to form the first, second, and third holes P1, P2, and P3, removing the first photoresist pattern, forming on the third interlayer dielectric layer 122 a second photoresist pattern (not shown) having an opening width greater than that of the first photoresist pattern, using the second photoresist pattern as an etching mask to etch the third interlayer dielectric layer 122 to form the first recess R1 on the first hole P1 and also to form the second recess R2 on the second and third holes P2 and P3, and then removing the second photoresist pattern.

For another example, the formation of the first and second recess structures RS1 and RS2 may include forming a first photoresist pattern (not shown) on the third interlayer dielectric layer 122, using the first photoresist pattern as an etching mask to etch the third interlayer dielectric layer 122 to form the first and second recesses R1 and R2, removing the first photoresist pattern, forming on the third interlayer dielectric layer 122 a second photoresist pattern (not shown) having an opening width less than that of the first photoresist pattern, using the second photoresist pattern as an etching mask to etch the third interlayer dielectric layer 122, the second buffer dielectric layer 120, the second dielectric layer 116, and the first dielectric layer 112 to form the first hole P1 below the first recess R1 and also to form the second and third holes P2 and P3 below the second recess R2 (including also etching the second interlayer dielectric layer 108 and the first buffer dielectric layer 106 to form third hole P3), and then removing the second photoresist pattern.

Referring back to FIG. 3, a first contact plug structure CPS1 and a second contact plug structure CPS2 may be formed in the third interlayer dielectric layer 122. The first contact plug structure CPS1 may be formed in the first recess structure RS1, and the second contact plug structure CPS2 may be formed in the second recess structure RS2. A third buffer dielectric layer 123 may be formed on the third interlayer dielectric layer 122. The third buffer dielectric layer 123 may cover a top surface of the first contact plug structure CPS1, a top surface of the second contact plug structure CPS2, and a top surface of the third interlayer dielectric layer 122.

According to some example embodiments of the present inventive concepts, there may be provided a metal-insulator-metal (MIM) capacitor including three electrodes. Accordingly, the capacitor may increase in capacitance.

According to some example embodiments of the present inventive concepts, a first contact plug may contact two electrodes, e.g., a first electrode and a third electrode, and may penetrate a third electrode while contacting a side surface and a portion of a top surface of the third electrode. As such, an increased contact area may be provided between the first contact plug and the third electrode, which may result in a reduction in resistance. In conclusion, the capacitor may have an increased capacitance (e.g., due to the reduction in resistance).

Spatially relative terms, such as "below," "lower," "above," "upper," "higher," "top," "side," "on," "vertical," "horizontal," "lateral," and the like, may be used herein for ease of description to describe one element or feature's relationship to another element(s) or feature(s) as illustrated in the figures. For example, as used herein, the terms "upper," "higher," "on" and/or "top" may refer to an element or feature further in the vertical direction (as depicted in FIG. 1) with respect to another element or feature, the terms "horizontal," "lateral," and/or "side" may refer to an element or feature with respect to a direction perpendicular or nearly perpendicular to the vertical direction, and the terms "lower" and/or "below" may refer to an element or feature further in a direction opposite the vertical direction with respect to another element or feature. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that when an element is referred to as being "connected" or "coupled" to another element, it can be directly connected, contacted and/or coupled to the other element or intervening elements may be present. As used herein the term "and/or" includes any and all combinations of one or more of the associated listed items.

Example embodiments are described herein with reference to cross-sectional illustrations that are schematic illustrations of idealized example embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Although the present invention concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor device, comprising:
   a first electrode on a substrate;
   a second electrode on the first electrode;
   a first dielectric layer between the first electrode and the second electrode;
   a third electrode on the second electrode;
   a second dielectric layer between the second electrode and the third electrode;
   a first contact plug penetrating the third electrode and contacting the first electrode; and
   a buffer dielectric layer on a top surface of the third electrode,
   wherein the first contact plug contacts the top surface of the third electrode and a side surface of the third electrode, the buffer dielectric layer does not cover a first portion of the top surface of the third electrode, and the first portion of the top surface of the third electrode is in contact with the first contact plug.

2. The semiconductor device of claim 1, wherein the first contact plug penetrates the first and second dielectric layers.

3. The semiconductor device of claim 1, wherein a bottom surface of the first contact plug is between a top surface of the first electrode and a bottom surface of the first electrode.

4. The semiconductor device of claim 1, wherein
   the first contact plug comprises:
      a first segment at least a portion of which being above the top surface of the third electrode, and
      a second segment between the top surface of the third electrode and a bottom surface of the first electrode, and
   a width of the first segment is greater than a width of the second segment.

5. The semiconductor device of claim 4, wherein
   a first surface of the first segment is not covered by the second segment, and
   the second segment is adjacent to the first surface of the first segment and extends towards a top surface of the substrate from the first surface of the first segment, the first surface of the first segment is parallel to the top surface of the substrate.

6. The semiconductor device of claim 5,
   wherein the buffer dielectric layer covers a second portion of the top surface of the third electrode, the second portion of the top surface of the third electrode being coplanar with the first surface of the first segment.

7. The semiconductor device of claim 5,
   wherein the buffer dielectric layer covers a second portion of the top surface of the third electrode, the second portion of the top surface of the third electrode being at a higher level than that of the first surface of the first segment.

8. The semiconductor device of claim 5, wherein
   the first contact plug comprises a first side surface and a second side surface facing each other,
   the first side surface of the first segment and the first side surface of the second segment are not aligned with each other,
   the second side surface of the first segment and the second side surface of the second segment are aligned with each other, and
   the first surface of the first segment connects the first side surface of the first segment to the first side surface of the second segment.

9. The semiconductor device of claim 4, wherein
a first surface of the first segment and a second surface of the first segment are not covered by the second segment,
the first surface of the first segment and the second surface of the first segment are parallel to a top surface of the substrate,
the second segment is between the first surface of the first segment and the second surface of the first segment, and extends towards a top surface of the substrate from the first surface of the first segment and the second surface of the first segment,
the first contact plug further comprises a first side surface and a second side surface facing each other,
the first side surface of the first segment and the first side surface of the second segment are not aligned with each other,
the second side surface of the first segment and the second side surface of the second segment are not aligned with each other,
the first surface of the first segment connects the first side surface of the first segment to the first side surface of the second segment, and
the second surface of the first segment connects the second side surface of the first segment to the second side surface of the second segment.

10. The semiconductor device of claim 1, further comprising:
a lower connection line between the substrate and the first electrode;
a second contact plug in contact with the second electrode;
an upper connection line on a top surface of the second contact plug; and
a through plug connecting the lower connection line to the upper connection line.

11. The semiconductor device of claim 10, further comprising:
a first interlayer dielectric layer on the third electrode;
a buffer dielectric layer on the first interlayer dielectric layer; and
a second interlayer dielectric layer on the buffer dielectric layer,
wherein the second contact plug penetrates the first interlayer dielectric layer and the buffer dielectric layer, and the upper connection line is in the second interlayer dielectric layer.

12. A semiconductor device, comprising:
a first electrode on a substrate, the first electrode having a first penetrating portion;
a first dielectric layer on a top surface of the first electrode and in the first penetrating portion;
a second electrode on the first dielectric layer, the second electrode having a second penetrating portion that does not overlap the first penetrating portion;
a second dielectric layer on a top surface of the second electrode and in the second penetrating portion;
a third electrode on the second dielectric layer, the third electrode having a third penetrating portion and a fourth penetrating portion, the third penetrating portion overlapping the second penetrating portion, the fourth penetrating portion overlapping the first penetrating portion; and
a first contact plug in the second and third penetrating portions, the first contact plug connecting the first electrode to the third electrode.

13. The semiconductor device of claim 12, wherein the first dielectric layer and the second dielectric layer are in contact with each other in the second penetrating portion.

14. The semiconductor device of claim 12, wherein a bottom surface of the first contact plug is between the top surface of the first electrode and a bottom surface of the first electrode.

15. The semiconductor device of claim 12, wherein the first contact plug is in contact with a side surface of the third electrode and a portion of a top surface of the third electrode, the side surface of the third electrode and the portion of the top surface of the third electrode overlapping the second penetrating portion.

16. The semiconductor device of claim 15, further comprising:
a buffer dielectric layer on the top surface of the third electrode,
wherein the buffer dielectric layer does not cover the side surface of the third electrode and the portion of the top surface of the third electrode, the side surface of the third electrode and the portion of the top surface of the third electrode being in contact with the first contact plug.

17. The semiconductor device of claim 12, further comprising:
a second contact plug on the first penetrating portion and connected to the second electrode;
a first upper connection line on the first contact plug; and
a second upper connection line on the second contact plug.

18. A semiconductor device, comprising:
a first electrode on a substrate;
a second electrode on the first electrode;
a third electrode on the second electrode;
a dielectric layer between the first electrode, the second electrode and the third electrode;
a first contact plug connecting the first electrode to the third electrode;
a second contact plug penetrating a portion of the dielectric layer and contacting the second electrode;
a lower connection line between the substrate and the first electrode;
an upper connection line on a top surface of the second contact plug; and
a through plug connecting the lower connection line to the upper connection line,
wherein a bottom surface of the first contact plug is higher than a bottom surface of the first electrode.

19. The semiconductor device of claim 18, further comprising:
a buffer dielectric layer on a top surface of the third electrode,
wherein the first contact plug penetrates the third electrode, the first contact plug contacts the top surface of the third electrode and a side surface of the third electrode, and the top surface of the third electrode and the side surface of the third electrode are not covered by the buffer dielectric layer.

20. The semiconductor device of claim 18, wherein
the first contact plug comprises:
a first segment above a top surface of the third electrode, and
a second segment below the top surface of the third electrode,
a width of the first segment is greater than a width of the second segment, and the first segment has a surface coplanar with the top surface of the third electrode.

\* \* \* \* \*